(12) United States Patent
Abe et al.

(10) Patent No.: US 7,608,991 B2
(45) Date of Patent: Oct. 27, 2009

(54) LIGHT EMITTING DEVICE

(75) Inventors: Shinichi Abe, Shiga (JP); Motohiko Asano, Shiga (JP); Kazumasa Kobayashi, Shiga (JP); Koji Murayama, Shiga (JP)

(73) Assignee: Kyocera Corporation, Fushimi-ku (JP)

( * ) Notice: Subject to any disclaimer, the term of this patent is extended or adjusted under 35 U.S.C. 154(b) by 539 days.

(21) Appl. No.: 11/280,684

(22) Filed: Nov. 16, 2005

(65) Prior Publication Data

US 2006/0102912 A1  May 18, 2006

(30) Foreign Application Priority Data

Nov. 16, 2004  (JP) ............................. 2004-332384
Oct. 28, 2005  (JP) ............................. 2005-314112

(51) Int. Cl.
*H01J 1/62* (2006.01)

(52) U.S. Cl. ........................ 313/501; 313/506; 313/504

(58) Field of Classification Search ......... 313/498–512, 313/315, 169.1, 169.3; 428/690–691, 917; 438/26–29, 34, 82; 257/40, 72, 98–100, 257/642–643, 759; 427/66, 532–535, 539, 427/58, 64; 445/24–25

See application file for complete search history.

(56) References Cited

U.S. PATENT DOCUMENTS

| | | | | |
|---|---|---|---|---|
| 6,963,168 B2 * | 11/2005 | Eida et al. | ................ | 313/506 |
| 2004/0145303 A1 * | 7/2004 | Yamada et al. | ............ | 313/504 |
| 2006/0267485 A1 * | 11/2006 | Wood et al. | ................ | 313/504 |

FOREIGN PATENT DOCUMENTS

| | | |
|---|---|---|
| JP | 2002-231443 | 8/2002 |
| JP | 2002-252082 | 9/2002 |

* cited by examiner

*Primary Examiner*—Peter J Macchiarolo
*Assistant Examiner*—Donald L Raleigh
(74) *Attorney, Agent, or Firm*—Volpe and Koenig, PC

(57) ABSTRACT

There is provided a light emitting device having a plurality of luminous elements emitting with different colors respectively being improved in a luminous intensity deviation and a color deviation without deterioration of a luminous efficiency. In the light emitting device having a plurality of luminous elements respectively emitting with different colors, both a traveling wave of light and a reflected wave of light enhance intensity of light.

24 Claims, 11 Drawing Sheets

LIGHT EMITTING DEVICE

BACKGROUND OF THE INVENTION

1. Technical Field

The present invention relates to a light emitting device, and more particularly, to a light emitting device having a plurality of luminous elements emitting different colors respectively.

2. Discussion of the Related Art

In recent years, an electroluminescent element (hereinafter, referred to as "luminous element") attracts attention of many researchers. In particular, efforts to employ such a luminous element to an image display device or an illuminating device have been actively made.

Generally, since a material constituting the luminous element has a poor resistance property to the exterior environment, it is necessary to appropriately protect (seal) the element from the exterior environment. Conventionally, as a method of sealing the element to be shut from the exterior environment, there are a method for bonding a sealed substrate using a sealing resin, a method for covering the element with a protecting layer, or combining the above two methods.

The latter one of the above methods, that is, the method of covering the luminous element with a protecting layer has characteristics of realizing a long life of the luminous element since an inorganic based material having a good blocking property to moisture or air may be used.

However, in the case that the protecting layer covering the luminous element is thin in a layer thickness, a problem which blocking to moisture or oxygen is not sufficient may be raised. On the contrary, in the case that the protecting layer is thick in the layer thickness, a problem may be raised, in which fabrication tact is deteriorated because it takes a predetermined time or more to form the film. Further, in the case that the layer thickness of the protecting layer is thick, peeling-off due to a film stress may be generated. Thus, the protecting layer is normally formed with a uniform thickness in a predetermined range of the layer thickness (for example, 300 nm~3 µm) by sufficiently blocking moisture or oxygen in order to prevent deterioration of the fabrication tact and prevent the peeling-off due to the film stress.

Further, a conventional technique of sealing the luminous element using the protecting layer is disclosed in, for example, Japanese Patent Publication No. 2002-231443 and Japanese Patent Publication No. 2002-252082. For example, JP 2002-231443 includes sealing by a protecting layer using a material having a refractivity in a range of the atmosphere through 3.5. Further, JP 2002-252082 includes forming an anti-reflective film on the surface of a sealing film in contact with the atmosphere.

Materials constituting the luminous element may be divided into two kinds according to their optical properties, that is, a transparent material forming a luminous layer, a charge transport layer, a charge injection layer, a transparent electrode and a protecting layer, and showing a relatively high refractivity in the wavelength range of visible rays, and a metal material (opaque material) forming an electrode or an electron injection layer, and showing a value that a real part of a complex refractivity is lower than an imaginary part thereof in the wavelength range of visible rays. A large light reflection is generated at the interface surface between the former (transparent material) and the latter (opaque material) since there exists a large refractivity difference at the interface surface therebetween. That is, the latter functions as an reflective layer with respect to the former. Further, a large light reflection is also generated on the surface of the protecting layer in contact with the exterior out of the element. Thus, light interference occurs between a plurality of reflection surfaces, and an efficiency to draw the light generated from a luminous layer toward the exterior out of the element (hereinafter, referred to as "luminous efficiency") is varied in accordance with thickness difference of each layer.

In the case of forming a color image display using a Top Emission type light emitting element drawing light from a side opposite to a substrate, an opaque anode, an organic layer (including a functional layer such as a charge (hole/electron) injection layer, a charge (hole/electron) transport layer, and the like), a transparent or translucent cathode, and a protecting layer are sequentially formed on the substrate. Further, a metal material is mostly used for the translucent cathode, and if a transparent cathode is used, a metal material is typically used for an electron injection layer. Alternatively, an opaque cathode, an organic layer, a transparent or translucent anode, and a protecting layer may be sequentially formed on the substrate.

Recently, a Dual Emission type luminous element drawing light from both a substrate side and a side opposite to the substrate is used, and the Dual Emission type luminous element is composed of a transparent or translucent anode, an organic layer, a transparent or translucent cathode, and a protecting layer, which are sequentially formed on the substrate. Alternatively, the Dual Emission type luminous element may be composed of a transparent or translucent cathode, an organic layer, a transparent or translucent anode, and a protecting layer, which are sequentially formed on the substrate.

In the luminous element structured as described above, there particularly exists an interface surface having a large light reflection. For example, in the case of using a transparent cathode in the Top Emission type, (a) upper surface of the protecting layer (b) upper surface of the electron injection layer (c) lower surface of the electron injection layer (d) upper surface of the anode may be interface surfaces having a large light reflection.

Further, in the case of using a translucent cathode in the Top Emission type, (a) upper surface of the protecting layer (b) upper surface of the cathode (c) lower surface of the cathode (d) upper surface of the anode may be interface surfaces having a large light reflection, respectively.

Further, for example, in the case of using a transparent anode and a transparent cathode, and employing a metal material for an electron injection layer in the Dual Emission type, (a) upper surface of the protecting layer (b) upper surface of the electron injection layer (c) lower surface of the electron injection layer (d) lower surface of the anode may be interface surfaces having a large light reflection, respectively.

Further, for example, in the case of using a transparent anode and a translucent cathode in the Dual Emission type, (a) upper surface of the protecting layer (b) upper surface of the cathode (c) lower surface of the cathode (d) lower surface of the anode may be interface surfaces having a large light reflection, respectively.

In the interface surfaces listed as above, by adjusting a layer thickness of the luminous layer to a different layer thickness in accordance with a luminous wavelength of each luminous element in common with the four cases, a degree of light interference of each luminous element occurring in the intervals of (b)~(c), (c)~(d), and (b)~(d) can be increased.

However, the layer thickness of the protecting layer cannot be adjusted in each luminous element to correspond to the degree of the light interference of the intervals of (a)~(b), (a)~(c), and (a)~(d) in common with the four cases because the layer thickness of the protecting layer is uniform in each luminous element by the reason described as above. Therefore, the conventional luminous element has problems that a wavelength maximized in a luminous efficiency is significantly different from a peak wavelength of the light generated from the luminous layer, and as a result, a luminous intensity is reduced, and a color purity is deteriorated and a color reproducibility is deteriorated.

Further, the conventional luminous element has problems that a layer thickness deviation exists inside the layer thickness of the protecting layer, and if an average layer thickness of the protecting layer is beyond the layer thickness value showing a maximized luminous efficiency, a large luminous intensity deviation or large color deviation may be generated even with a uniform layer thickness deviation.

SUMMARY OF THE INVENTION

Therefore, the present invention is directed to provide a light emitting device being improved in a luminous intensity deviation and a color deviation by ensuring a good color purity and a good color reproducibility.

In accordance with an exemplary embodiment, the present invention provides a light emitting device including a plurality of luminous elements emitting different colors respectively, each element including a first electrode, a second electrode transmitting light, and a luminous layer disposed between an upper surface of the first electrode and a lower surface of the second electrode. The light emitting device also includes a protecting layer covering the plurality of luminous elements, placed on an upper surface of the second electrode; and a control layer placed on the upper surface of the second electrode of at least one luminous element in the plurality of luminous elements. The light emitting device has a structure that both a traveling wave of light and a reflected wave of light enhance intensity of light in each of the plurality of luminous elements.

In accordance with another exemplary embodiment, the present invention provides an another light emitting device including a plurality of luminous elements emitting different colors respectively, each element including a first electrode, a second electrode transmitting light, a luminous layer disposed between the first electrode and the second electrode, and a reflective layer disposed between the first electrode and the second electrode. The light emitting device also includes a protecting layer covering the plurality of luminous elements, placed on the second electrode of the luminous element; and a control layer placed on an upper surface of the second electrode of at least one luminous element in the plurality of luminous elements. The light emitting device has a structure that both a traveling wave and a reflected wave of light traveling enhance intensity of the light in each of the plurality of luminous elements.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully with reference to the attached drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same numbers refer to the corresponding elements throughout the specification.

EXEMPLARY EMBODIMENT 1

Figure 1:
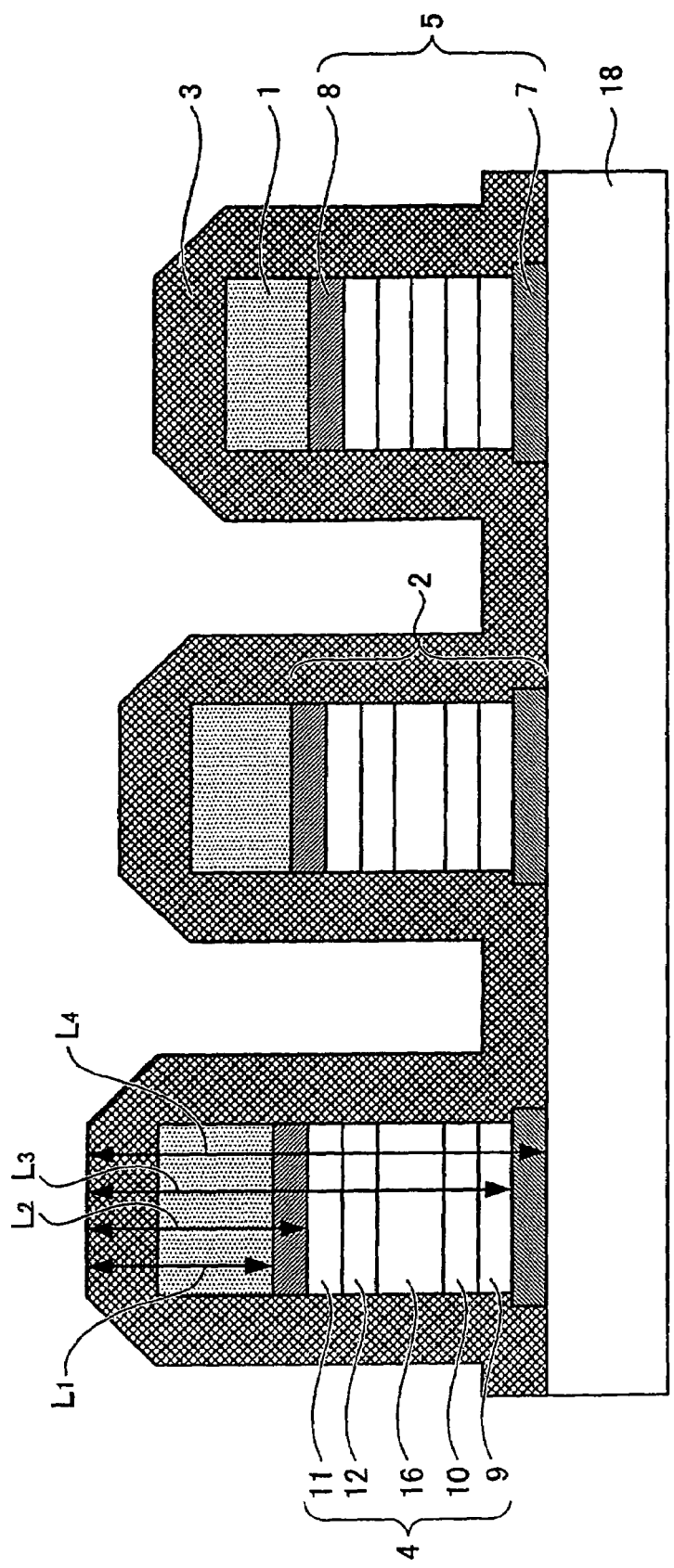
FIG. 1 is a view illustrating the structure of a light emitting device according to a first embodiment of the present invention.
Figure 9:
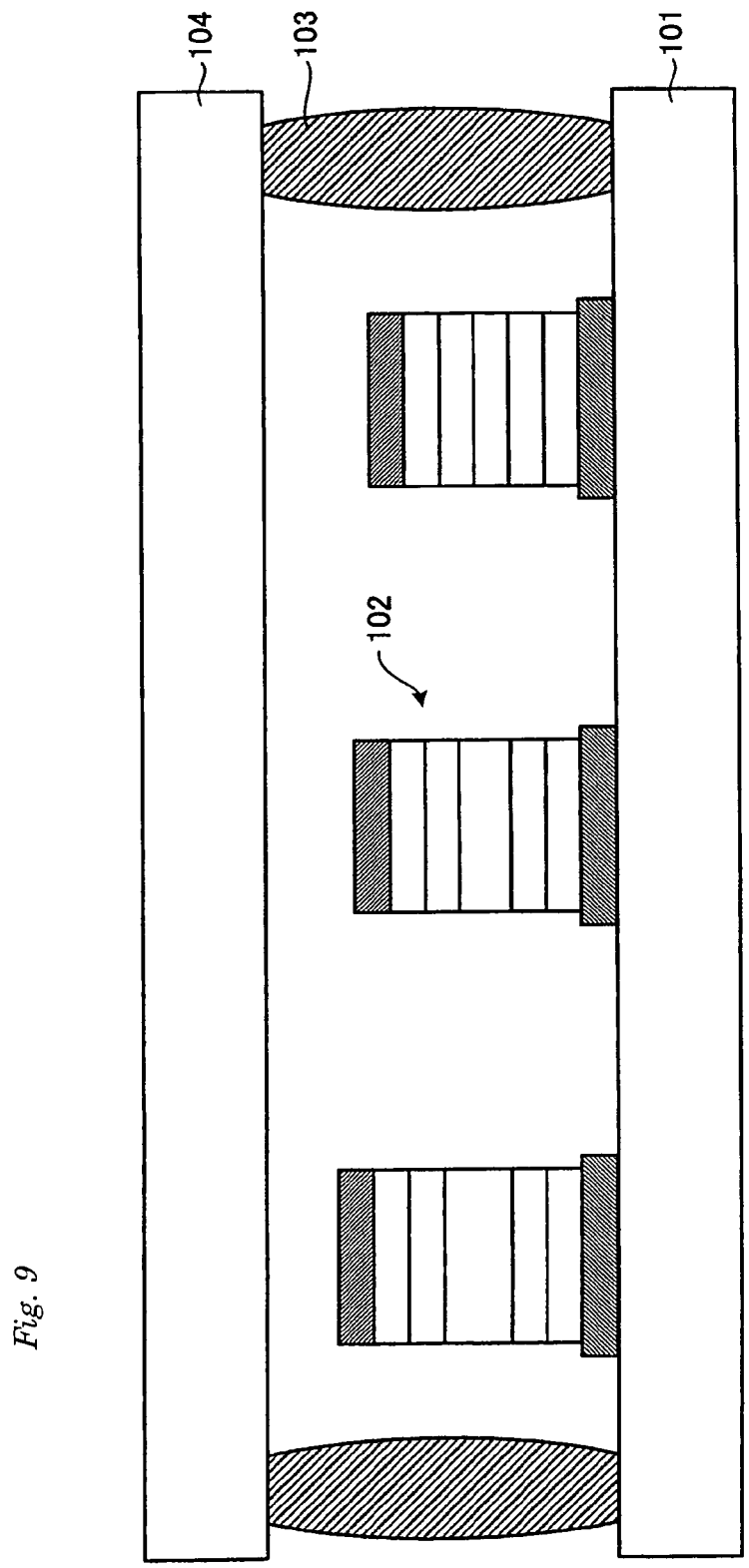
FIG. 9 is a view illustrating a structure of a conventional light emitting device.
Figure 10:
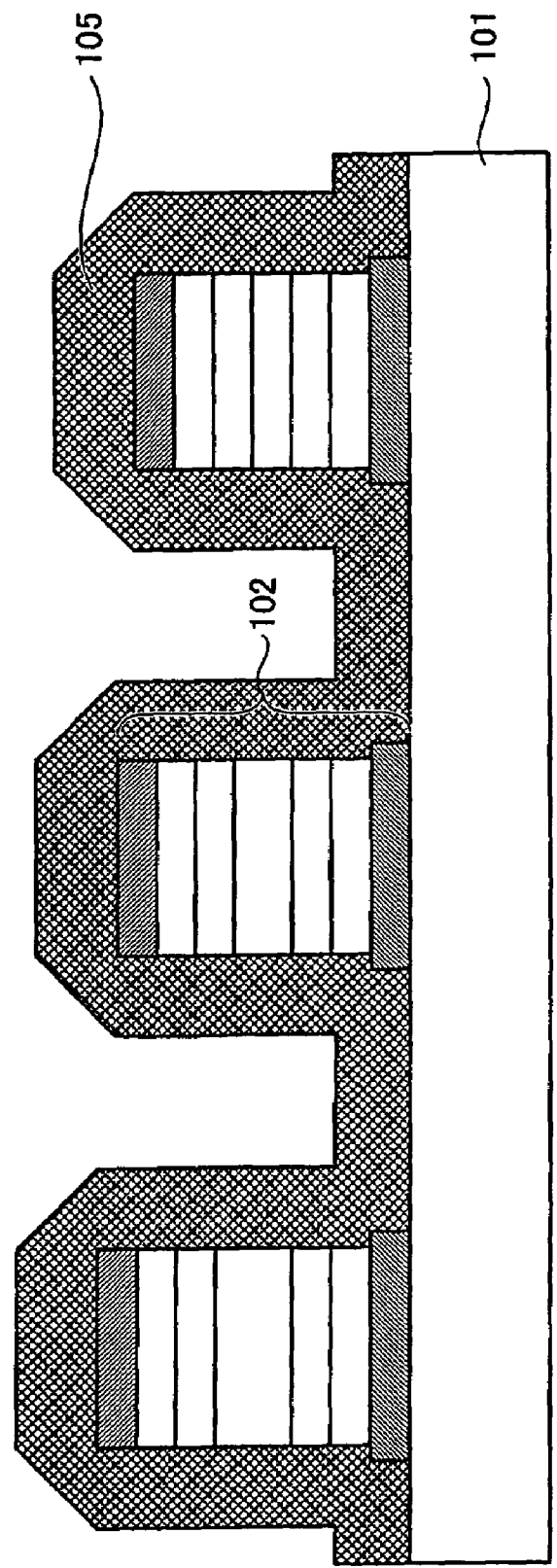
FIG. 10 is a view illustrating a structure of a conventional light emitting device.

FIG. 1 is a view illustrating the structure of a light emitting device according to a first embodiment of the present invention, and FIGS. 9 and 10 are views illustrating the structure of a conventional light emitting device.

The light emitting devices illustrated in FIGS. 1, 9 and 10 show Top Emission type of structures emitting light from the side opposite to a substrate respectively. For example, the conventional light emitting device of FIG. 9 is structured such that a sealed (protecting) substrate 104 is bonded to a substrate 101 with a resin 103, thereby protecting the plurality of luminous elements 102 (a luminous element emitting blue color, a luminous element emitting red color, and a luminous element emitting green color) on the substrate 101 from the exterior environment. Further, the conventional light emitting device of FIG. 10 is structured such that a plurality of luminous elements 102 formed on a substrate 101 are covered with a protecting layer 105. Further, the protecting layer of the light emitting device of FIG. 10 is typically formed with a uniform layer thickness of 300 nm through 3 μm, in order not to reduce fabrication tact, and in order to restrain peeling-off due to a film stress by sufficiently shutting off water and oxygen, which may have influence on the characteristics of the luminous elements or their life times.

In the meantime, as shown in FIG. 1, the light emitting device according to the first embodiment of the present invention is structured such that a plurality of luminous elements 2 (red color, green color, and blue color luminous elements) are formed on a substrate 18, and the luminous element 2 includes a pair of electrodes 5, and a multi-layered organic layer 4 having a luminous layer stacked between the pair of electrodes 5. The pair of electrodes 5 are composed of a first electrode 7, which reflects at least a portion of light toward the organic layer 4, and a second electrode 8, which transmits at least a portion of light. The first electrode 7 may be composed of any conductive material, such as transparent, translucent, or opaque material only if it can reflect light, but the first electrode 7 is preferably formed of a translucent electrode or opaque electrode in order to increase a reflectivity of light. Further, the second electrode 8 may be composed of any conductive material, only if it can transmit light, but the second electrode 8 is preferably formed of a translucent electrode or transparent electrode in order to increase a transparency of light.

A control layer 1 is formed on the second electrode 8, and a protecting layer 3 is formed on the control layer 1 to cover the control layer 1 and the entire luminous element 2. As such, the light emitting device according to the first embodiment of the present invention is structured such that the control layer 1 is formed between the second electrode 8 and the protecting layer 3 as an uppermost layer unlike a following second embodiment. Further, each layer formed between the pair of electrodes 5 may be composed of a different material (for example, inorganic material) from the organic material.

Further, FIG. 1 illustrates one example of a five-layered structure, in which the organic layer 4 is composed of, for example, a charge (hole/electron) injection layer 9, a charge (hole/electron) transport layer 10, a luminous layer 16, a charge (electron/hole) transport layer 12, and a charge (electron/hole) injection layer 11, which are sequentially stacked upwardly. However, the structure of the organic layer 4 is not limited to the five-layered structure as above, but various structures such as two-layered, three-layered, four-layered, or one-layered (only luminous layer) structures may be employed.

Herein, various conditions may include, for example, a reflection property (opaque, translucent, or transparent) of the first electrode and the second electrode, a polarity (anode or cathode), or a kind of luminous colors (red, green, or blue). If the conditions are different, the material used in each layer is different. As one example, a material such as an Alq3 (aluminoquinoline complex) shows light emitting of a green color, and has a good electron transportation property. Thus, in the luminous element emitting green color light, a luminous layer and an electron transport layer may be typically composed of a single material of Alq3 and the like. Further, in the case of using a transparent electrode, a metal electron injection layer is mostly used.

Then, a method of forming respective layers constituting the light emitting device of FIG. 1, and composition of the layers will be explained. In FIG. 1, the protecting layer 3 is composed of a material having a low transmission coefficient with respect to water and oxygen, such as a silicon nitride film. The protecting layer 3 is formed with a thickness of 300 nm through 3 µm, which is significantly thick as compared to the layer thickness sum of the pair of electrodes 5 and the organic layer 4, that is, 100 nm through 200 nm. Therefore in the course of forming the film of the protecting layer 3, it is necessary to form a film at a high speed in order not to reduce fabrication tact. Further, a chemical method such as a chemical vapor deposition (CVD) method and the like may be used in order to facilitate a high densification of films, or provide a good step coverage.

Further, in addition to the CVD method to form the protecting layer 3, it may be considered that a metal mask is employed, and a deposition method is performed to each of the plurality of luminous elements. However, the CVD method is preferable because the materials for the protecting layer typically have a high melting point and a high boiling point, and the deposition method to form the protecting layer 3 may damage the organic layer due to heat, and because it is difficult to form the film with high densification on the ground that the deposition method does not involve chemical reaction. Alternatively, it may be considered that the metal mask is used in the CVD method, but it is preferable not to use the metal mask because the metal mask has a large film wraparound at its edge, and it is difficult to use a magnet in fixing the metal mask, which is necessary to apply a predetermined magnetic field.

Hereinafter, differences of the transparent electrode, the opaque electrode, and the translucent electrode will be explained. The transparent electrode is composed of a material having an optical property for transmitting most of visible light and having a relatively high electric conductivity. In the meantime, the opaque electrode is composed of a material having an optical property for blocking most of visible light and having a relatively high electric conductivity. The translucent electrode has an intermediate property between those of the transparent electrode and the opaque electrode, and necessarily has an optical property for transmitting visible light. In order to provide such an optical property, the translucent electrode is formed with a small thickness.

A typical material of the transparent electrode may include, for example, indium tin oxide (ITO), indium zinc oxide (IZO), and the like. Further, the layer of the transparent electrode is formed preferably with a thickness of 50 nm or more, or preferably, with a thickness of 100 nm through 300 nm. Further, a typical material of the opaque electrode is, for example, Al and the like. A preferable layer thickness of the opaque electrode is 50 nm or higher, and more preferably, may be in a range of 100 nm through 300 nm. Further, a preferable material of the translucent electrode may include, for example, alkali metal such as Li, alkaline earth metal such as Mg, Ca, Sr, Ba, or Al, Si, Ag, and a preferable layer thickness of the translucent electrode is 100 nm or lower, and a more preferable layer thickness thereof is in a range of 5 nm through 50 nm.

The control layer 1 is disposed below the protecting layer 3 in the luminous wavelengths of respective luminous elements, and functions to control to increase a luminous efficiency to the exterior out of the elements. Thus, an application of various colors may be performed on the control layer 1 in accordance with a kind of respective luminous elements (luminous wavelengths). Further, the control layer 1 may be formed by a deposition method using, for example, a metal mask.

The control layer 1 is preferably composed of a transparent organic material such as styrylarylene, polysilane, or a transparent inorganic material such as titanium oxide, zinc sulfide. In particular, the organic material has advantages of suppressing damage on the luminous elements due to temperature increase of the substrate as a deposition temperature of the organic material can be decreased, and easily suppressing pattern blurring due to the distortion of the metal mask because of temperature increase of the metal mask.

Further, in the light emitting device of the embodiment of the present invention, since the control layer 1 is formed to contact with the second electrode 8, the control layer 1 may be formed in the same chamber as that of the fabrication equipment system where the organic layer 4 or the second electrode 8 is formed, or in the fabrication equipment system of the same vacuum degree as that with which the organic layer 4 or the second electrode 8 is formed. Therefore, a size of the fabrication equipment system may be compact, and fabrication processes may be highly tact.

Figure 2:
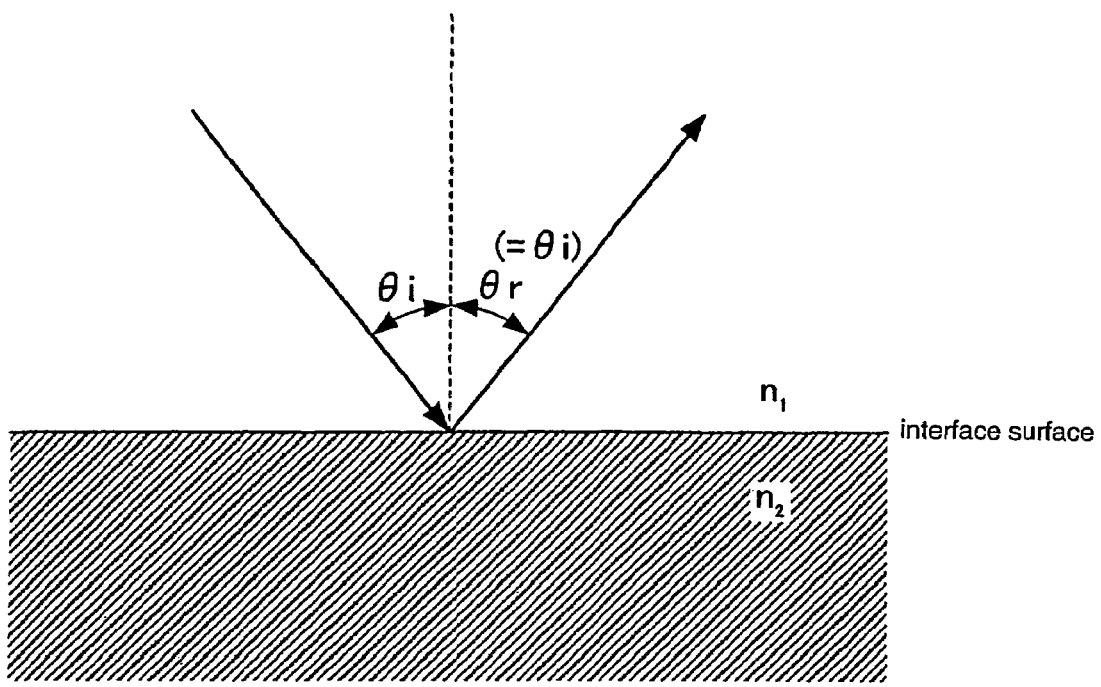
FIG. 2 is a view illustrating a reflection phenomenon of the incident light coming in an interface surface having a different refractivity.

FIG. 2 is a view illustrating a reflection phenomenon of the incident light coming in an interface surface having a different refractivity. In FIG. 2, if the light enters from a medium of a refractivity $n_1$ to a medium of a refractivity $n_2$ with an incident angle of $\theta i$, and then, is reflected with a reflective angle $\theta r$ (=$\theta i$) at the interface surface, relations between $n_1$, $n_2$, $\theta i$, and a reflectivity r at the interface surface may be represented as follows.

$$r = [n_1 \cdot \cos(\theta i) - [n_2^2 - n_1^2 \cdot \sin^2(\theta i)]^{1/2}] / \qquad (1)$$
$$[n_1 \cdot \cos(\theta i) + [n_2^2 - n_1^2 \cdot \sin^2(\theta i)]^{1/2}]$$

In particular, if the incident light vertically comes in the interface surface, $\theta i$ is equal to 0° ($\theta i$=0°) in Formula 1, and Formula 1 may be simplified as follows.

$$r = (n_1 - n_2)/(n_1 + n_2) \qquad (2)$$
$$= [1 - (n_2/n_1)]/[1 + (n_2/n_1)]$$

As understood from Formula 2, as a refractivity ratio at the interface surface is increased, a reflectivity is increased. Further, a phase of a reflective wave at the interface surface is changed by a quantity relation of the refractivity at the interface surface. For example, in the case of $n_1 < n_2$, r is a minus real number, and a phase variation $\phi$ at the period interface surface is as follows.

$$\phi = \arg(r) = \pi$$

In the case of $n_1 > n_2$, r is a plus real number, and a phase variation $\phi$ at the period interface surface is as follows.

$$\phi = \arg(r) = 0$$

Further, like an interval from the upper surface of the second electrode 8 to the upper surface of the protecting layer 3, or an interval from the upper surface of the organic layer 4 to the upper surface of the protecting layer 3, in the case that there exists an interface surface having a high reflectivity out of the interval, a reflectivity r is not simple like Formula 1 or Formula 2, and is given by a function formula of a refractivity of the material out of the interval and a layer thickness. But, a phase variation $\phi$ at the period interface surface is also given by a deflection angle of the reflectivity r.

Then, a preferable layer thickness of the control layer 1 of the light emitting device shown in FIG. 1 adjusted for each luminous element (luminous wavelength) will be explained. In FIG. 1, in the case that the first electrode 7 is composed of an opaque anode and the second electrode 8 is composed of a translucent cathode, an interface surface having a high reflectivity will be listed as follows.

(a) interface surface between the protecting layer 3 and the exterior(upper surface of the protecting layer 3)

(b) interface surface between the control layer 1 and the second electrode 8 (upper surface of the second electrode 8)

(c) interface surface between the organic layer 4 and the second electrode 8 (lower surface of the second electrode 8)

(d) interface surface between the organic layer 4 and the first electrode 7 (upper surface of the first electrode 7)

In the respective interface surfaces as described above, as shown in FIG. 1, an interval from the upper surface of the second electrode 8 to the upper surface of the protecting layer 3 is defined as a first interval, an interval from the upper surface of the organic layer 4 to the upper surface of the protecting layer 3 is defined as a second interval, and an interval from the upper surface of the first electrode 7 to the upper surface of the protecting layer 3 is defined as a third interval. The intervals are respectively indicated by optical distances $L_1$, $L_2$, $L_3$. Further, a luminous wavelength of the luminous element is indicated by $\lambda$. Further, the optical distance $L_i$ of each interval can be given using a refractivity $n_i$ and a layer thickness $d_i$ of each layer in the interval as follows.

$$L_i = \Sigma n_i \cdot d_i \qquad (3)$$

Now, in a phase variation $\phi_1$ of the light, which enters from control layer 1 to the interface surface between the control layer 1 and the second electrode 8, and is reflected toward the control layer 1, a layer thickness of the control layer 1 is adjusted to set an optical distance $L_1$ so that a traveling wave of the light inside the first interval and a reflected wave thereof enhance intensity of the light each other. In specific, for example, it is preferable to set the layer thickness of the control layer 1 to satisfy a following formula for respective luminous elements of red color, blue color, and green color.

$$|L_1 + (\phi_1/\pi - 2m)\lambda/4| < \lambda/8 \qquad (4)$$

$$(-\pi < \phi_1 \leq \pi, m=0, 1, 2, \ldots)$$

In Formula 4, $\phi_1$ is a phase variation when light is reflected from the interface surface, m is an arbitrary positive integer, and there exists m to satisfy Formula 4. Further, $|\alpha|$ means an absolute value of $\alpha$.

Further, the traveling wave of light means the expression of the light coming from a luminous layer toward a protecting layer as waves, and the reflected wave of light means the expression of the light reflected within the interval and come out toward a protecting layer as waves. Further, $\lambda/8$ at the right side of Formula 4 is a threshold value to determine whether the control layer 1 is formed with a desired layer thickness or not. If the left side of Formula 4 is greater than $\lambda/8$, interference between the traveling wave and the reflected wave within the interval is deteriorated.

In the same way, if a phase variation of the reflected light, which enters from the second electrode 8 to the interface surface between the second electrode 8 and the organic layer 4, and is reflected toward the second electrode 8, is $\phi_2$, a layer thickness of the control layer 1 is adjusted to set an optical distance $L_2$ so that both a traveling wave of the light and a reflected wave of the light within the second interval enhance intensity of the light. In specific, for example, it is preferable to set the layer thickness of the control layer 1 to satisfy a following formula for respective luminous elements of red color, blue color, and green color.

$$|L_2 + (\phi_2/\pi - 2m)\lambda/4| < \lambda/8 \qquad (5)$$

$$(-\pi < \phi_2 \leq \pi, m=0, 1, 2, \ldots)$$

Further, if a phase variation of the reflected light, which enters from the organic layer 4 to the interface surface between the organic layer 4 and the first electrode 7, and is reflected toward the organic layer 4, is $\phi_3$, a layer thickness of the control layer 1 is adjusted to set an optical distance $L_3$ so that both a traveling wave of the light within the third interval and a reflected wave thereof enhance intensity of the light. In specific, for example, it is preferable to set the layer thickness of the control layer 1 to satisfy a following formula for respective luminous elements of red color, blue color, and green color.

$$|L_3+(\phi_3/\pi-2m)\lambda/4|<\lambda/8 \qquad (6)$$

$$(-\pi<\phi_3\leq\pi, m=0, 1, 2, \ldots)$$

Further, a refractivity n is measured by a well-known ellipsometry method. Further, $\lambda$ is measured using a spectrophotometer. Further, $\phi$ is determined by a following method. That is, n and d of the layer existing in the region in which light passes and which is out of a corresponding interval (for example, out of a first interval in the case of measuring $\phi_1$, out of a second interval in the case of measuring $\phi_2$, out of a third interval in the case of measuring $\phi_3$, and out of a fourth interval in the case of measuring $\phi_4$) are measured, and then, a reflectivity r is calculated by a characteristic matrix method in an optical thin film using the values. Thus, a deflection angle of the reflectivity r is achieved.

Further, it is more preferable to set the layer thickness of the control layer 1 to satisfy all the conditions shown in Formulas 4 through 6. However, even though satisfying any one of the conditions shown in Formulas 4 through 6, a luminous intensity deviation or a color deviation can be improved as compared to the conventional light emitting device.

Further, when a refractivity of the control layer 1 is $n_1$, a refractivity of the protecting layer 3 as one side in contact with the control layer 1 is $n_2$, and a refractivity of the second electrode 8 as the other side in contact with the control layer 1 is $n_3$, if materials are selected such that the refractivities satisfy a relationship of $n_3<n_1<n_2$ or $n_2<n_1<n_3$, light reflection at the interface surface between the second electrode 8 and the control layer 1 is reduced, and thus, light interference in the protecting layer 3 is deteriorated. As a result, change of a luminous efficiency due to the layer thickness change of the protecting layer 3 can be suppressed. Referring to Table 1, in the case that the second electrode 8 is composed of magnesium, and the protecting layer 3 is formed of a silicon nitride film, if the control layer 1 is made of a silicon oxynitride, alumina, a silicon oxide, aluminum fluoride, barium fluoride, calcium fluoride or magnesium fluoride, and the like, it is acknowledged that the refractivities satisfy the relationship of $n_3<n_1<n_2$. Further, size of a refractivity is determined by size of the real part of a complex refractivity.

TABLE 1

| subject layer | material | refractivity |
| --- | --- | --- |
| protecting layer | silicon nitride film | 1.83 |
| control layer | silicon oxynitride film | 1.5~1.7 |
| control layer | alumina | 1.64 |
| control layer | silicon oxide film | 1.46 |
| control layer | aluminum fluoride | 1.4 |
| control layer | barium fluoride | 1.3 |
| control layer | calcium fluoride | 1.4 |
| control layer | magnesium fluoride | 1.38 |
| second electrode | Magnesium | 0.569 |

Further, if a material satisfying a relation of $0.6\leq(n_1/n_2)\leq1.9$ between a refractivity $n_1$ of the control layer 1 and a refractivity $n_2$ of the protecting layer 3 is selected, light reflection at the interface surface of the control layer 1 and the protecting layer 3 is deteriorated, and thus, light interference in the protecting layer 3 is deteriorated. As a result, change of a luminous efficiency due to the layer thickness change of the protecting layer 3 can be more effectively suppressed.

The above description has been made on the condition of a preferable layer thickness of the control layer 1 in the case that the second electrode 8 is composed of a translucent electrode in FIG. 1, but may be employed to the case that the second electrode 8 is composed of a transparent electrode. In this case, for example, a phase variation $\phi_2$ in Formula 4 may be a phase variation of the light, which enters from the second electrode 8 to the interface surface on the lower surface of the charge (electron) injection layer 11, and is reflected toward the second electrode 8, and an optical distance $L_2$ in Formula 4 may be an optical distance from the lower surface of the charge (electron) injection layer 11 to upper surface the protecting layer 3.

Further, the above description may be employed to the case that the second electrode 8 is composed of a translucent anode, or the case that the second electrode 8 is composed of a transparent anode. For example, in the case that the second electrode 8 is composed of a translucent anode, it is just like the case that an anode and a cathode are replaced, and the same condition as the case that the second electrode 8 is composed of a translucent cathode is become. Further, the case that the second electrode 8 is composed of a transparent anode is just like the case that the second electrode 8 is composed of a transparent cathode.

In the meantime, in the case that the first electrode 7 is composed of a transparent anode, and the second electrode 8 is composed of a translucent cathode in a Dual Emission type luminous element, interface surfaces having a large light reflection will be listed as follows.

(a) interface surface between the protecting layer 3 and the exterior(upper surface of the protecting layer 3)

(b) interface surface between the control layer 1 and the second electrode 8 (upper surface of the second electrode 8)

(c) interface surface between the organic layer 4 and the second electrode 8 (lower surface of the second electrode 8)

(d) interface surface between the substrate 18 and the first electrode 7 (lower surface of the first electrode 7)

In the interface surfaces as described above, the interface surfaces (a)~(c) are identical to the interface surface having a high reflectivity when the first electrode 7 is composed of a translucent anode and the second electrode 8 is composed of a translucent cathode, and the interface surface (d) only is different. Thus, a new interval from a lower surface of the first electrode 7 to an upper surface of the protecting layer 3 is defined as a fourth interval (optical distance $L_4$). Further, the optical distance $L_4$ of the fourth interval may be calculated using Formula 3 based on a refractivity of each layer and a layer thickness thereof in the intervals.

At this time, if a phase variation of the reflected light, which enters from the organic layer 4 to the interface between the first electrode 7 and the substrate 18, and is reflected toward the organic layer 4, is $\phi_4$, a layer thickness of the control layer 1 is adjusted to set an optical distance $L_4$ so that both a traveling wave and a reflected wave of the light within the fourth interval enhance intensity of the light. For example, it is preferable to set the layer thickness of the control layer 1 to satisfy a following formula for respective luminous elements of red color, blue color, and green color.

$$|L_4+(\phi_4/\pi-2m)\lambda/4|<\lambda/8 \qquad (7)$$

$$(-\pi<\phi_4\leq\pi, m=0, 1, 2, \ldots)$$

The control layer 1 is preferably set with a layer thickness to satisfy all the conditions shown in Formulas 4 through 7, but even though it is formed with a layer thickness to satisfy any one of the conditions shown in Formulas 4 through 7, a luminous intensity deviation or a color deviation can be improved as compared to the conventional light emitting device.

In the light emitting device according to the embodiments of the present invention as described above, if an interval from the upper surface of the second electrode to the upper surface of the protecting layer is defined as a first interval, an interval from the lower surface of the second electrode to the upper surface of the uppermost layer is defined as a second interval, and an interval from the upper surface of the first electrode to the upper surface of the uppermost layer is defined as a third interval, since an optical distance of each interval is set such that both a traveling wave and a reflected wave of the light traveling within any one of the first through third intervals enhance intensity of the light, a good color purity and a good color reproducibility are ensured, thereby improving a luminous intensity deviation or a color deviation.

Further, since an interval from the lower surface of the first electrode to the upper surface of the uppermost layer is defined as a fourth interval, and an optical distance of the interval is set such that both a traveling wave of the light and a reflected wave of the light traveling inside any one of the first through fourth intervals enhance intensity of the light, a good color purity and a good color reproducibility are ensured, thereby improving a luminous intensity deviation or a color deviation. All the luminous elements are preferably made to satisfy all the Formulas.

Further, a layer thickness of the control layer 1 is preferably thinner than a thickness of the protecting layer 3. This is because it is difficult to satisfy the Formulas for all of luminous elements in which the control layer 1 is formed, thereby productivity may be deteriorated since the layer thickness of the control layer 1 is greater and a uniform film is hardly formed. In particular, the control layer 1 is preferably formed with a thickness 50% the layer thickness of the protecting layer 3 or less.

Further, in the embodiment, the control layer is formed in each of the three kinds of luminous elements, but it is not necessary to form the control layer in all kinds of luminous elements. Alternatively, the control layer may be formed only in the first kind or the second kind of luminous element.

EXEMPLARY EMBODIMENT 2

Figure 3:
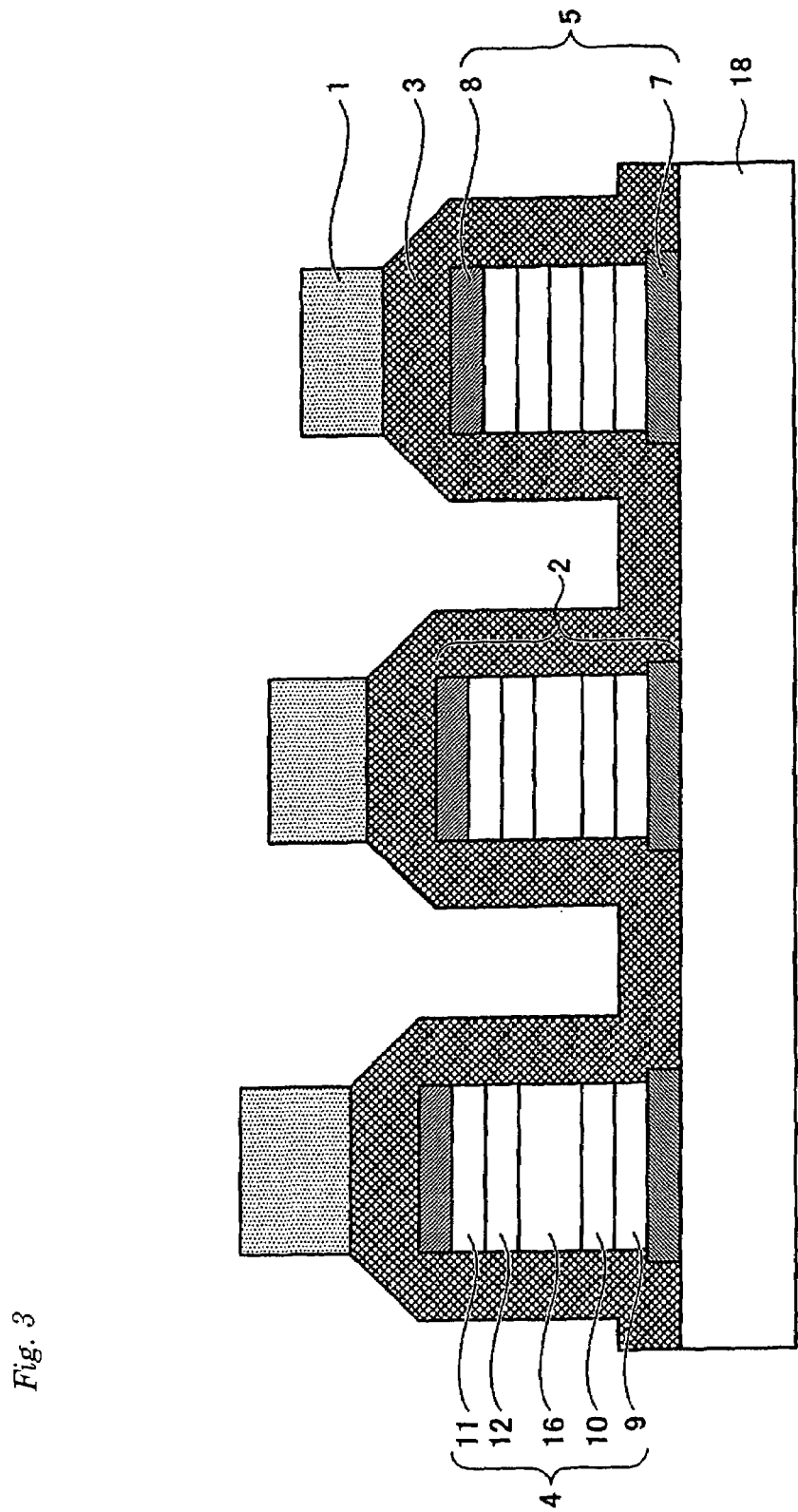
FIG. 3 is a view illustrating the structure of a light emitting device according to a second embodiment of the present invention.

FIG. 3 is a view illustrating the structure of a light emitting device according to a second embodiment of the present invention. The light emitting device of FIG. 3 illustrates the structure, in which a control layer 1 is interposed between the element exterior and a protecting layer 3. Thus, the control layer 1 of the light emitting device according to the second embodiment is formed as the uppermost layer unlike the structure of the first embodiment. In addition to that, other component elements are identical to or similar to those of the structure of the first embodiment, and the same numbers refer to the corresponding elements.

As described above, since the light emitting device of the second embodiment has the structure basically identical to the structure of the first embodiment except that the control layer 1 is formed as the uppermost layer, the light emitting device of the second embodiment provides the same functions and effects as those of the first embodiment.

In the light emitting device of the second embodiment, a method such as an oxygen-assist deposition method may be used in order to form the control layer 1 after the protecting layer 3 is formed. Even though the oxygen-assist deposition method has a disadvantage of easily damaging the luminous element, since the oxygen-assist deposition method may be employed after covering the entire luminous elements with the protecting layer 3 in the light emitting device of the second embodiment, damage on the luminous elements can be significantly reduced. Therefore, the control layer in the light emitting device of the second embodiment can be formed with a high densification and a high transparency, and an excellent resistance property to the environment.

Further, in a refractivity $n_1$ of the control layer 1, a refractivity $n_2$ of the protecting layer 3 on one side of the control layer 1, and a refractivity $n_3$ of the exterior (outside air) as the other side of the control layer 1, materials are selected to satisfy a relation of $n_3 < n_1 < n_2$, light reflection at the interface between the control layer 1 and the exterior is deteriorated, and thus, light interference in the protecting layer 3 is deteriorated. As a result, change of a luminous efficiency due to change of layer thickness of the protecting layer 3 can be suppressed. The refractivity $n_3$ of the exterior is about 1.0 if the exterior out of the element is the atmosphere. In this case, referring to Table 1, if the protecting layer 3 is formed of a silicon nitride film, and the control layer 1 is formed of a silicon oxynitride film, alumina, and the like, the relation of $n_3 < n_1 < n_2$ is satisfied.

EXEMPLARY EMBODIMENT 3

Figure 4:
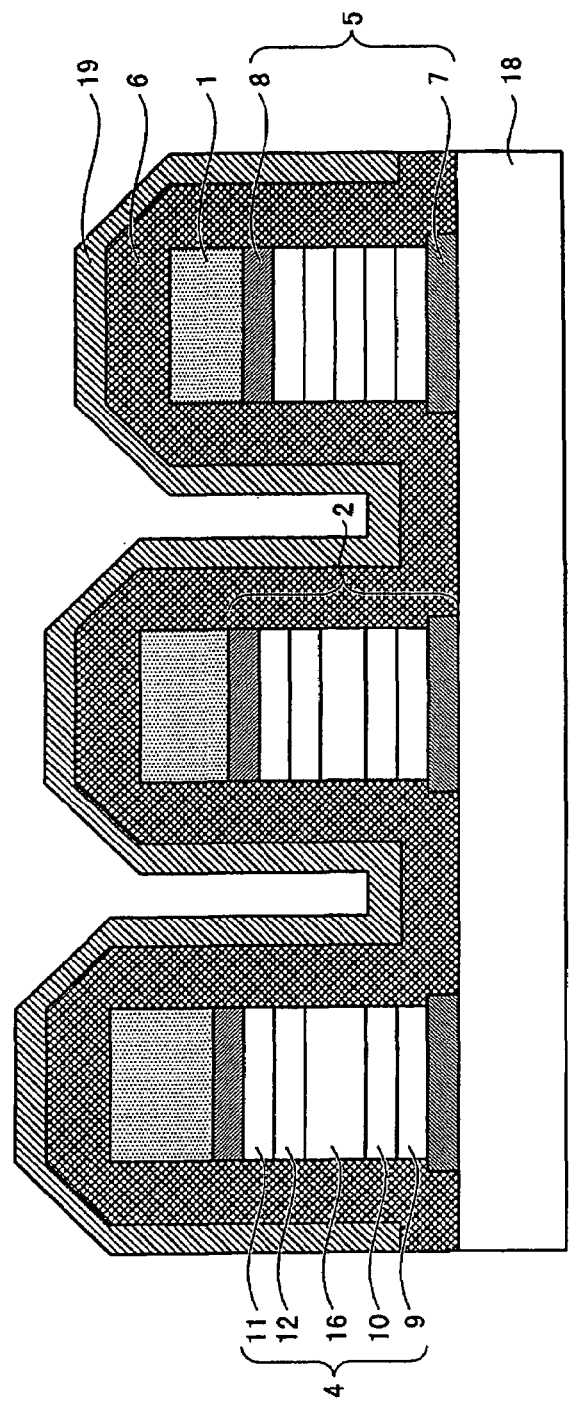
FIG. 4 is a view illustrating the structure of a light emitting device according to a third embodiment of the present invention.

FIG. 4 is a view illustrating the structure of a light emitting device according to a third embodiment of the present invention. The light emitting device of FIG. 4 illustrates that the protecting layer 3 is composed of a first protecting layer 6 and a second protecting layer 19 in the structure of the first embodiment. Further, in addition to that, other component elements are identical to or similar to those of the structure according to the first embodiment, and the same numbers refer to the corresponding elements.

As described above, since the light emitting device of the third embodiment has the structure basically identical to the structure of the first embodiment except that the protecting layer 3 is composed of the first protecting layer 6 and the second protecting layer 19, the light emitting device of the third embodiment provides the same functions and effects as those of the first embodiment.

In FIG. 4, if the second protecting layer 19 is composed of a low refractivity material, and the first protecting layer 6 is composed of a high refractivity material, since refractivity difference between the first protecting layer 6 and the exterior out of the elements is reduced by the second protecting layer 19, light interference inside the first protecting layer 6 may be deteriorated. As a result, change of a luminous efficiency due to change of layer thickness of the first protecting layer 6 can be suppressed.

Further, in addition to the functions of the second protecting layer 19 for reducing the refractivity difference between the first protecting layer 6 and the exterior out of the element, and deteriorating the light interference of the first protecting layer 6, the second protecting layer 19 may also function as an anti-reflective layer for preventing reflection of external light from the exterior toward the element.

Further, the third embodiment illustrates an example of the light emitting device, in which the protecting layer 3 is composed of, the first protecting layer 6 and the second protecting layer 19, but is not limited to two layers, and may have a multi-layer structure of three layers or more. In particular, since gradient of refractivity difference between the luminous element and the exterior out of the element can be reduced, and light interference inside the protecting layer can be deteriorated with the multi-layer structure, change of a luminous efficiency due to change of a layer thickness of the protecting layer can be more effectively suppressed.

As described above, according to the light emitting device of the embodiment, since the protecting layer blocking the exterior is composed of a plurality of layers, change of a luminous efficiency due to change of a layer thickness of the protecting layer can be effectively suppressed.

EXEMPLARY EMBODIMENT 4

Figure 5:
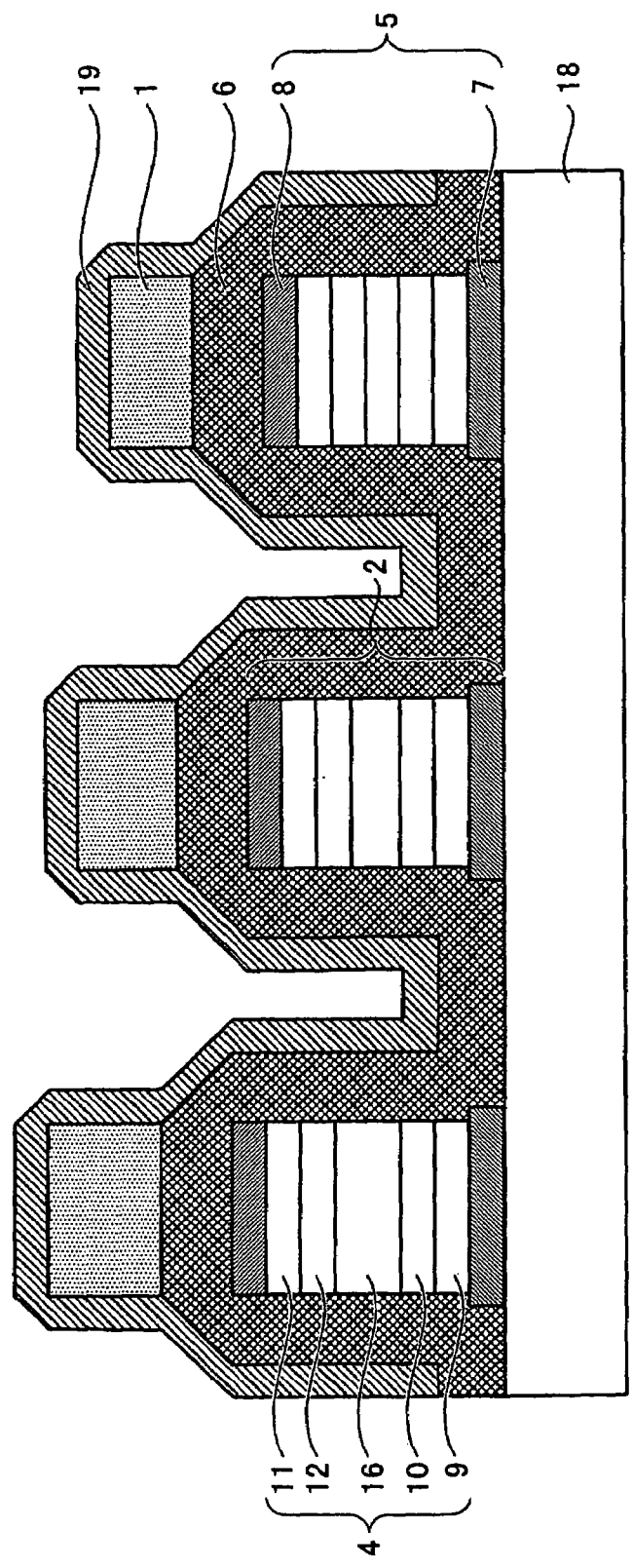
FIG. 5 is a view illustrating the structure of a light emitting device according to a fourth embodiment of the present invention.

FIG. 5 is a view illustrating the structure of a light emitting device according to a fourth embodiment of the present invention. The light emitting device of FIG. 5 further includes a second protecting layer 19 for protecting a protecting layer 3 and a control layer 1 formed on the protecting layer 3 in the structure of the second embodiment shown in FIG. 3. Further, in addition to that, other component elements are identical to or similar to those of the structure according to the second embodiment, and the same numbers refer to the corresponding elements.

As described above, since the light emitting device of the fourth embodiment has the structure basically identical to the structure of the second embodiment except that the structure of the fourth embodiment further includes a second protecting layer 19 covering the first protecting layer 6 and the control layer 1, the light emitting device of the fourth embodiment provides the same functions and effects as those of the second embodiment.

Further, the light emitting device of the fourth embodiment exemplifies a case that the control layer 1 is interposed between the first protecting layer 6 and the second protecting layer 19. On the other hand the present invention is not limited to above constitution, but the second protecting layer 19 may have a multi-layered structure, such as two layers or more. In this case, change of a luminous efficiency due to change of a layer thickness of the first protecting layer 6 can be more effectively suppressed, since gradient of refractivity difference between the luminous element and the exterior out of the element can be reduced, and light interference inside the protecting layer can be deteriorated with the multi-layer structure.

As described above, the light emitting device of the fourth embodiment can effectively suppress change of a luminous efficiency due to change of a layer thickness of the first protecting layer since the control layer is interposed between the first protecting layer and the second protecting layer.

Further, the second protecting layer 19 in FIG. 5 may function as an anti-reflective layer for restraining reflection of the external light toward the elements from the exterior in addition to functions of reducing a refractivity difference between the first protecting layer 6 and the exterior environment out of the elements, and deteriorating an optical interference of the first protecting layer 6.

EXEMPLARY EMBODIMENT 5

Figure 6:
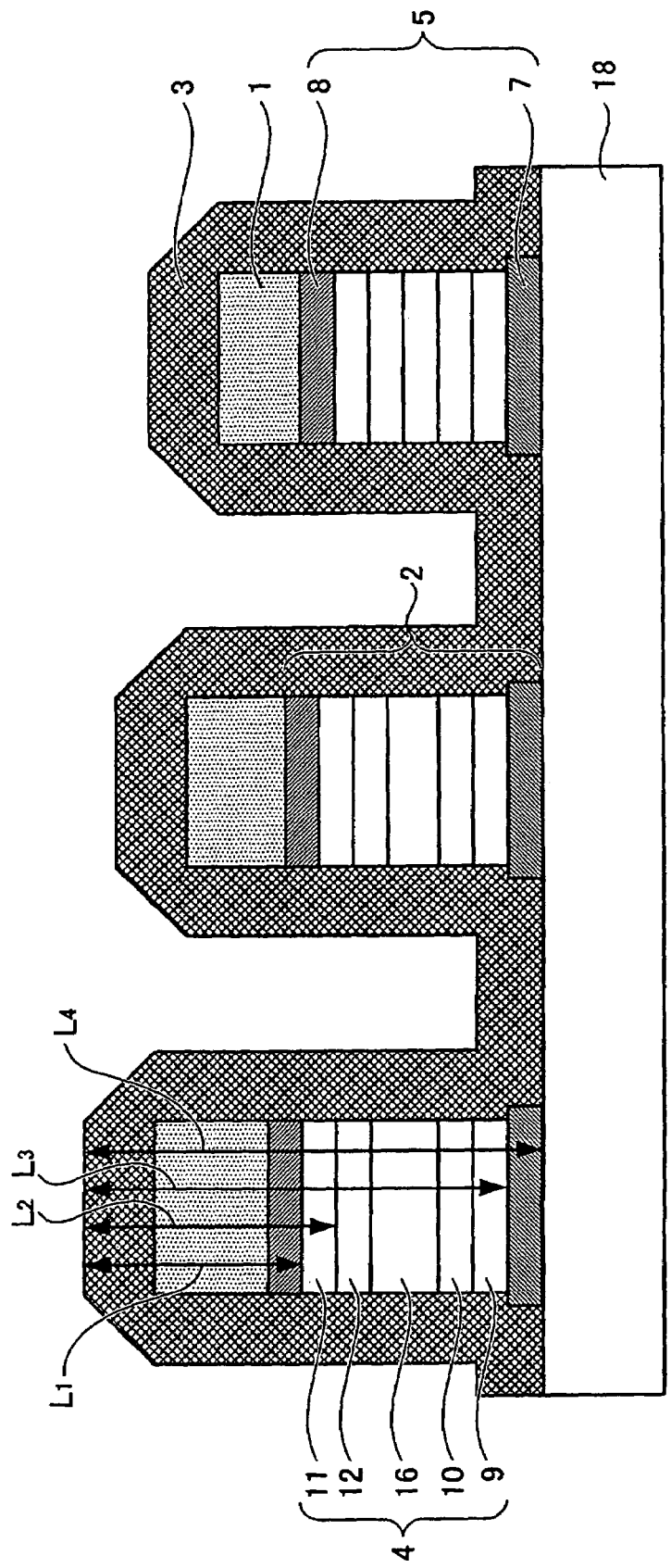
FIG. 6 is a view illustrating the structure of a light emitting device according to a fifth embodiment of the present invention.

FIG. 6 is a view illustrating the structure of a light emitting device according to a fifth embodiment of the present invention. The light emitting device of FIG. 6 illustrates that the second electrode 8 in the structure of the first embodiment is formed of a transparent electrode. In this case, a charge injection layer 11 in contact with the second electrode 8 functions as an reflective layer. In addition to that, other component elements are identical to or similar to those of the structure according to the first embodiment, and the same numbers refer to the corresponding elements.

The charge injection layer 11 in contact with the second electrode 8 as a transparent electrode is composed of a material such as a translucent electrode, and a preferable layer thickness of the charge injection layer 11 is 50 nm or lower, and a more preferable layer thickness thereof is in a range of 1 nm through 30 nm.

Further, while a refractivity of a transparent electrode is 1.7 through 2.3, a complex refractivity of a charge injection material composed of a metal material has 0.01 through 1 in its real part, and 1 through 10 in its imaginary part, which is lower in a real part and higher in an imaginary part than that of the transparent electrode. Generally, the charge injection layer 11 is necessarily composed of a material having a refractivity, which is lower in its real part of the complex refractivity and higher in its imaginary part thereof than that of the second electrode 8 so that the charge injection layer 11 functions as an reflective layer.

Then, in the light emitting device of FIG. 6, a preferable layer thickness of the control layer 1 controlling a luminous wavelength of each luminous element will be explained. In FIG. 6, interface surfaces having a high reflectivity are listed as follows.

(a) interface surface between the protecting layer 3 and the exterior(upper surface of the protecting layer 3)

(b) interface surface between the second electrode 8 and the charge injection layer 11 (upper surface of the charge injection layer 11)

(c) interface surface between the charge transport layer 12 and the charge injection layer 11 (lower surface of the charge injection layer 11)

(d) interface surface between the organic layer 4 and the first electrode 7 (upper surface of the first electrode 7)

In the respective interface surfaces, as shown in FIG. 6, when a first interval (optical distance $L_1$) from an upper surface of the charge injection layer 11 to an upper surface of the protecting layer 3, a second interval (optical distance $L_2$) from a lower surface of the charge injection layer 11 to an upper surface of the protecting layer 3, and a third interval (optical distance $L_3$) from an upper surface of the first electrode 7 to an upper surface of the protecting layer 3 are defined respectively based on Formula 3, a layer thickness of the control layer 1 may be preferably adjusted to set the optical distance of each interval so that a traveling wave of the light and a reflected wave of the light inside the first through third intervals thereof enhance intensity of the light each other.

Further, a layer thickness of the control layer 1 is preferably set to satisfy the conditions in Formulas 4 through 6 for each luminous element, but even though to satisfy any one condition of the conditions in Formulas 4 through 6, a luminous intensity deviation or a color deviation can be improved like other embodiments as compared to the conventional light emitting device.

Further, the control layer 1 is not necessarily formed on all kinds of luminous elements, but may be formed in one kind or two kinds of luminous elements like other embodiments.

In the meantime, if the luminous element is a Dual Emission type, for example, in the case that the first electrode 7 is composed of a transparent electrode, interface surfaces having a high reflectivity are listed as follows.

(a) interface surface between the protecting layer 3 and the exterior out of the elements (upper surface of the protecting layer 3)

(b) interface surface between the second electrode 8 and the charge injection layer 11 (upper surface of the charge injection layer 11)

(c) interface surface between the charge transport layer 12 and the charge injection layer 11 (lower surface of the charge injection layer 11)

(d) interface surface between the substrate 18 and the first electrode 7 (lower surface of the first electrode 7)

Thus, in the case that the luminous element is a Dual Emission type, a fourth interval (optical distance $L_4$) from a lower surface of the first electrode 7 to an upper surface of the protecting layer 3, which is defined based on Formula 3, is added, and a layer thickness of the control layer 1 is preferably adjusted to set the optical distance of each interval so that both a traveling wave of the light and a reflected wave of the light inside the first through fourth intervals enhance intensity of the light.

The optical distances ($L_1$~$L_4$) of the first through fourth intervals are preferably set so that a layer thickness of the control layer 1 satisfies the Formulas 4 through 7, but even though satisfies any one condition of the conditions in Formulas 4 through 7, a luminous intensity deviation or a color deviation can be improved like other embodiments as compared to the conventional light emitting device.

Further, like other embodiments, the control layer 1 is not necessarily formed in all kinds of luminous elements, but may be formed in one kind or two kinds of luminous elements.

As described above, according to the light emitting device of the embodiment, when an interval from an upper surface of the charge injection layer to an upper surface of the protecting layer is defined as a first interval, an interval from a lower surface of the charge injection layer to an upper surface of the uppermost layer is defined as a second interval, and an interval from an upper surface of the first electrode to an upper surface of the uppermost layer is defined as a third interval, since optical distances of the respective intervals are set so that both a traveling wave of the light and a reflected wave of the light traveling within any one interval of the first through third intervals enhance intensity of the light, a good color purity and a good color reproducibility are ensured, and thus, a luminous intensity deviation or a color deviation can be improved.

Further, according to the light emitting device of the embodiment, when an interval from a lower surface of the first electrode to an upper surface of the uppermost layer is defined as a fourth interval, since optical distances of the respective intervals are set so that both a traveling wave of the light and a reflected wave of the light traveling within any one interval of the first through fourth intervals enhance intensity of the light, a good color purity and a good color reproducibility are ensured, and thus, a luminous intensity deviation or a color deviation can be improved.

EMBODIMENT 1

Figure 7:
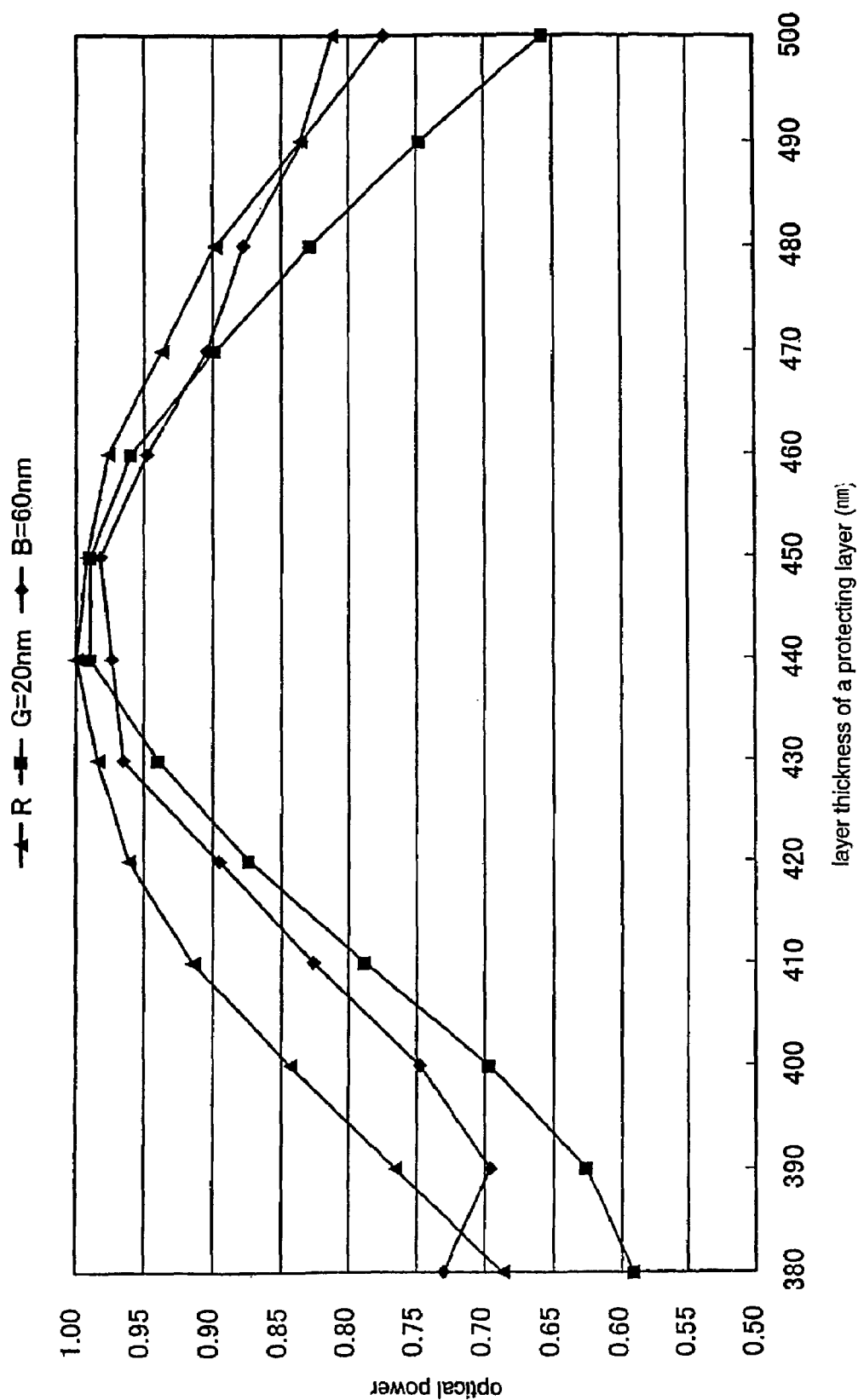
FIG. 7 is a graph illustrating optical power characteristics for a layer thickness of a protecting layer in the light emitting device of FIG. 1.

Then, a first embodiment of the present invention will be explained. In the embodiment, a protecting layer 3 is formed with a layer thickness of 440 nm in a luminous element of red color to maximize light output even without a control layer 1, and in a luminous element of green color and a luminous element of blue color, a control layer 1 is formed so that the protecting layer 3 is formed with a thickness of 440 nm to maximize light output like the luminous element of red color. FIG. 7 is a graph illustrating optical power characteristics for a layer thickness of a protecting layer in the light emitting device of FIG. 1. In FIG. 7, a curve ploted in a triangle shape illustrates the characteristic of the luminous element of red color, a curve ploted in a rectangular shape illustrates the characteristic of the luminous element of green color, and a curve ploted in a rhombic shape illustrates the characteristic of the luminous element of blue color. Further, materials and layer thicknesses of the respective layers are as follows.

Figure 11:
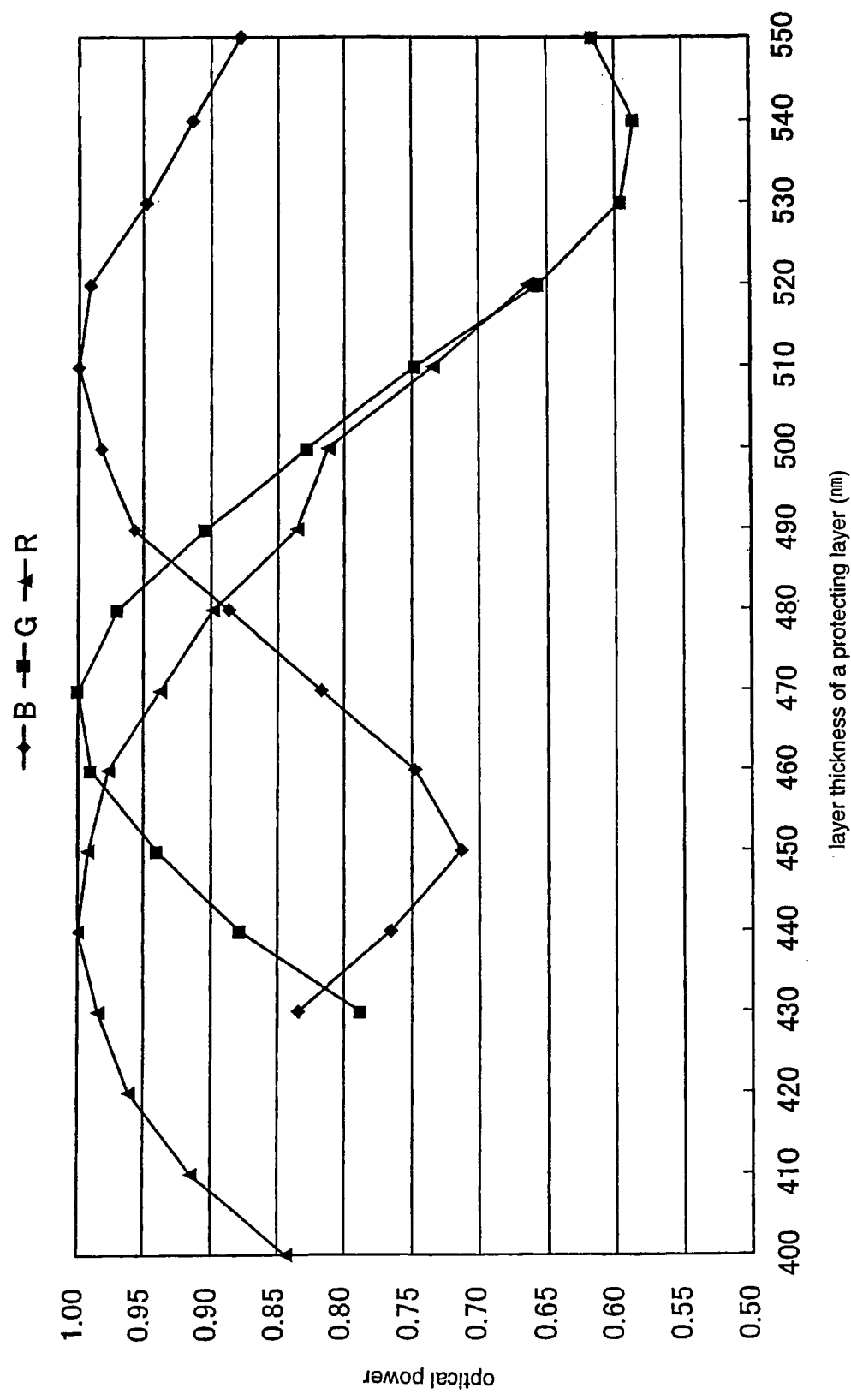
FIG. 11 is a view illustrating optical power characteristics for a layer thickness of a protecting layer when any one of red color, green color, and blue color luminous elements does not have a control layer.

(a) hole injection layer 9: none
(b) hole transport layer 10
　material: NPB
　layer thickness: 60 nm (red), 40 nm (green, blue)
(c) luminous layer 16
　host material: Alq3 (red, green), SDPVBi (blue)
　host layer thickness: 60 nm (red, green), 30 nm (blue)
　dopant material: DCJTB (red), cumarine (green), styrylamine (blue)
(d) electron transport layer 12: none
(e) electron injection layer 11
　material: magnesium
　layer thickness: 10 nm
(f) cathode 8
　material: ITO
　layer thickness: 200 nm
(g) control layer 1
　material: styrylarylene
　layer thickness: none(red), 20 nm (green), 60 nm (blue)
(h) protecting layer 3
　material: silicon nitride film
　layer thickness: 400 nm In the meantime, FIG. 11 is a view illustrating optical power characteristics for a layer thickness of a protecting layer when neither red, green, nor blue color luminous element has a control layer. The optical power of FIGS. 7 and 11 is normalized such that the maximum optical powers of the red, green, and blue colors shown in FIG. 5 are '1'. Further, when the layer thicknesses of the protecting layers formed in the respective luminous elements of the light emitting device shown in FIG. 11 are 440 nm [red], 470 nm [green], 510 nm [blue], the optical power of each color is maximized.

As comparing the graphs of FIGS. 7 and 11, the maximum optical power (Pmax) in the graph of FIG. 7 is PRmax=1.00 [red: standard value], PGmax=0.99 [green], and PBmax=0.98 [blue], and with the presence of a control layer, values around the maximum values can be maintained. Further, in FIG. 7, a layer thickness range W of the protecting layer to satisfy a relation of 0.9×Pmax<P<Pmax is WR=72 nm (±8.1%), WG=49 nm (±5.4%), WB=59 nm (±6.6%), and overlapped with all the colors of red, green, and blue colors. In the meantime, a layer thickness range W of the protecting layer in FIG. 11 does not overlapped with red and blue colors. This shows that a layer thickness distribution of the protecting layer is improved to allow to ±5.4% since each luminous element of the light emitting device includes a control layer for controlling a luminous wavelength of each element.

Further, Table 2 illustrates wavelength, refractivities, phase variation$\phi_1$ and an optical distance $L_1$ of the electron injection layer 11, the cathode 8, the control layer 1, and the protecting layer 3 in the embodiment.

TABLE 2

| | | red | green | Blue |
|---|---|---|---|---|
| | wavelength λ(nm) | 610 | 520 | 450 |
| refractivity n | silicon nitride layer | 1.82 | 1.83 | 1.85 |
| | styrylarylene | — | 1.86 | 1.92 |
| | ITO | 2.01 | 2.07 | 2.13 |
| $L_1$(nm) | control layer exists | — | 1256 | 1355 |
| | control layer not exist | 1203 | 1219 | 1240 |
| | $\phi_1$ | 0 | 0 | 0 |

The optical distance $L_1$ is defined by an interval from an upper surface of the electron injection layer 11 to an upper surface of the protecting layer 3. Since magnesium as a material constituting the electron injection layer 11 has a lower refractivity than that of ITO constituting the cathode 8, a large reflection is generated at the interface surface of ITO and magnesium. Further, referring to Table 2, when m=4 in a luminous element of red color, m=5 in a luminous element of green color, and m=6 in a luminous element of blue color in the embodiment, it is acknowledged that it satisfies a relation of $|L_1+(\phi_1/\pi-2m)\lambda/4|<\lambda/8(-\pi<\phi_1\leq\pi)$. On the contrary, when the control layer 1 is not present, the m does not exist to satisfy the above relation in luminous elements of the blue color and green color. In the case of FIG. 7, the optical distance $L_1$ is set such that a traveling wave of the light and a reflected wave of the light enhance intensity of the light in all the luminous elements, and thus, a good color purity and a good color reproducibility are ensured, and a luminous intensity deviation or a color deviation can be improved. In the meantime, since a traveling wave of the light and a reflected wave of the light are not placed to enhance intensity of the light in some luminous elements in the case of FIG. 11, a luminous intensity deviation is increased.

EMBODIMENT 2

Figure 8:
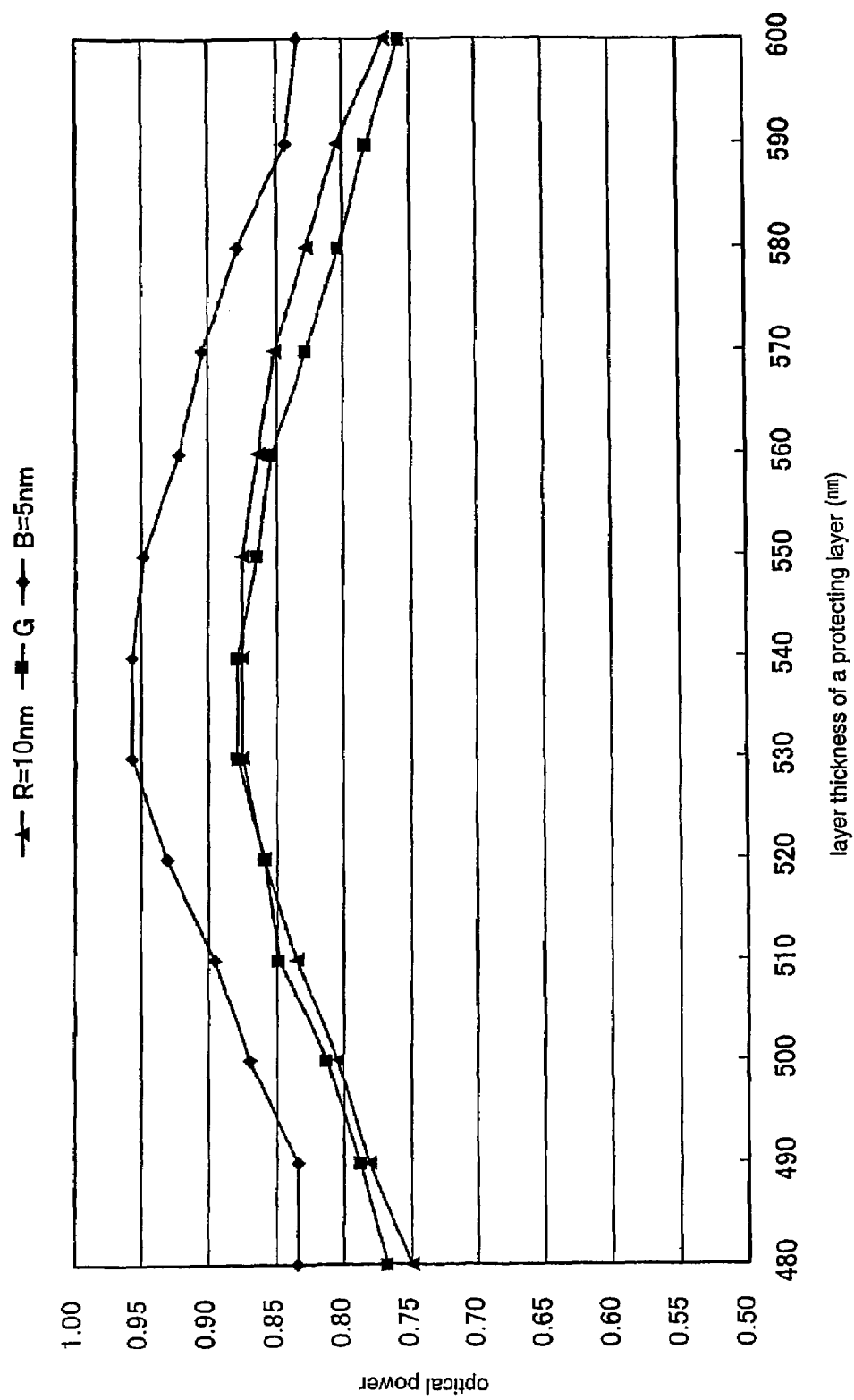
FIG. 8 is a graph illustrating optical power characteristics for a layer thickness of the protecting layer in the light emitting device of FIG. 4.

Then, a second embodiment of the present invention will be explained. FIG. 8 is a graph illustrating optical power characteristics for a layer thickness of the protecting layer of the light emitting device of FIG. 4. In FIG. 8, a curve ploted in a triangle shape illustrates the characteristic of the red color luminous element, a curve ploted in a rectangular shape illustrates the characteristic of the luminous element of green color, and a curve ploted in a rhombic shape illustrates the characteristic of the luminous element of blue color. Further, in materials and layer thicknesses of the respective layers, different parameters from those of the light emitting device shown in FIG. 7 are listed as follows.

(a) protecting layer 3 (a first protecting layer)
   material: silicon nitride film
   layer thickness: 480~600 nm (transverse axis of FIG. 8)
(b) control layer 1
   material: styrylarylene
   layer thickness: 10 nm (red), none (green), 5 nm (blue)
(c) second protecting layer 19
   material: silicon oxide film
   layer thickness: 90 nm In FIG. 8, the maximum value of the vertical axis (optical power) of FIG. 8 is normalized like the graph of FIG. 7 such that the maximum optical powers of the red, green, and blue colors in FIG. 5 are '1'. As comparing the graphs of FIGS. 7 and 8, in the maximum values (Pmax) of the optical power of FIG. 8, PRmax=0.88 [red], PGmax=0.88 [green], PBmax=0.96 [blue], which are slightly reduced as compared to the maximum values of respective colors of FIG. 7. However, in a layer thickness range W of the protecting layer satisfying a relation of 0.9×Pmax<P<Pmax in FIG. 8, WR=102 nm (±9.4%), WG=95 nm (±8.8%), WB=88 nm (±8.1%), and they overlapped with all the colors, red, green, and blue. This shows that a layer thickness distribution of the protecting layer 3 shown in the first embodiment is improved to allow to ±8.1% since the control layer 1 and the second protecting layer 19 are formed.

Further, Formulas 4 through 7 consider a phase variation $\phi$ when reflection occurs at the interface surfaces, the phase variation $\phi$ may be often approximately 0 (zero) when the light emitting device is designed in much consideration of a face brightness of the device as in the embodiment. In this case, Formulas 4 through 7 may be modified as follows without consideration of a phase variation.

$$|L-m\lambda/2|<\lambda/8 \quad (8)$$

$(L=L_1, L_2, L_3$ or $L_4$, m=0, 1, 2, ... )

Further, in the case that the phase variation $\phi$ is not limited to approximately 0 (zero), but is placed in a range of, for example, $-\pi/4<\phi<\pi/4$, the influence is reduced. Thus, a layer thickness of the control layer 1 can be set using Formula 8 even in this case.

When the light emitting device is designed in much consideration of suppressing dependence on angular field of the device, the phase variation $\phi$ may be often approximately $\pi$. In this case, by substituting for the phase change of Formulas 4 through 7 by $\pi$, Formula 9 can be shown as follows.

$$|L-(2m-1)\lambda/4|<\lambda/8 \quad (9)$$

$(L=L_1, L_2, L_3$ or $L_4$, m=0, 1, 2, ... )

In the case that the phase variation $\phi$ is not limited to approximately $\pi$, but is placed in a range of, for example, $-\pi<\phi<-3\pi/4$ or $3\pi/4<\phi<\pi$, the influence is reduced. Thus, a layer thickness of the control layer 1 can be set using Formula 9 even in this case.

As described above, the light emitting device according to the present invention is useful for a light source for an image display, and particularly, is preferable to improve a luminous intensity deviation, a color deviation of the image display, and the like.

According to the present invention, a good color purity and a good color reproducibility are ensured, and thus, a luminous intensity deviation and a color deviation can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device comprising:
   a plurality of luminous elements emitting different colors, respectively, each element including a first electrode, a second electrode transmitting light, and a luminous layer disposed between an upper surface of the first electrode and a lower surface of the second electrode;
   a protecting layer covering the plurality of luminous elements, placed on an upper surface of the second electrode; and
   a control layer placed on the upper surface of the second electrode of one luminous element or more in the plurality of luminous elements, wherein
   when an interval from an upper surface of an uppermost layer among layers placed on an upper surface of the second electrode to the upper surface of the second electrode is defined as a first interval, an interval from a lower surface of the second electrode to the upper surface of the uppermost layer is defined as a second interval, and an interval from the upper surface of the first electrode to the upper surface of the uppermost layer is defined as a third interval, the first through the third intervals include a region outside of the luminous element, and
   optical distances of the respective intervals are set such that both a traveling wave of light and a reflected wave of light traveling within at least the first interval in the first through third intervals enhance intensity of light in each of the plurality of luminous elements.

2. A light emitting device comprising:
a plurality of luminous elements emitting different colors, respectively, each element including a first electrode, a second electrode transmitting light, a luminous layer disposed between the first electrode and the second electrode, and a reflective layer disposed between the first electrode and the second electrode;
a protecting layer covering the plurality of luminous elements, placed on the second electrode of the luminous element; and
a control layer placed on the second electrode of one luminous element or more in the plurality of luminous elements, wherein
when an interval from an upper surface of an uppermost layer among layers placed on an upper surface of the second electrode to an upper surface of the reflective layer is defined as a first interval, an interval from a lower surface of the reflective layer to the upper surface of the uppermost layer is defined as a second interval, and an interval from an upper surface of the first electrode to the upper surface of the uppermost layer is defined as a third interval, the first through the third intervals include an region outside of the luminous element, and
optical distances of the respective intervals are set such that both a traveling wave of light and a reflected wave of light traveling within at least the first interval in the first through third intervals enhance intensity of light in each of the plurality of luminous elements.

3. The light emitting device according to claim 1, wherein, when a luminous wavelength of the luminous element is defined as $\lambda$, a phase change of the light incident from a side of the uppermost layer to the upper surface of the second electrode and being reflected from the upper surface of the second electrode to the side of the uppermost layer is defined as $\phi_1$, the optical distance of the first interval is defined as $L_1$, a phase change of the light incident from a side of the upper surface of the second electrode to the lower surface of the second electrode and being reflected from the lower surface of the second electrode to the side of the upper surface of the second electrode is defined as $\phi_2$, the optical distance of the second interval is defined as $L_2$, a phase change of the light incident from a side of the luminous layer to the upper surface of the first electrode and being reflected from the upper surface of the first electrode to the side of the luminous layer is defined as $\phi_3$, and the optical distance of the third interval is defined as $L_3$, there exists 0 or higher integers m satisfying one or more formulas in following formulas;

$$|L_1+(\phi_1/\pi-2m)\lambda/4|<\lambda/8(-\pi<\phi_1\leq\pi)$$

$$|L_2+(\phi_2/\pi-2m)\lambda/4|<\lambda/8(-\pi<\phi_2\leq\pi)$$

$$|L_3+(\phi_3/\pi-2m)\lambda/4|<\lambda/8(-\pi<\phi_3\leq\pi).$$

4. The light emitting device according to claim 2, wherein, when a luminous wavelength of the luminous element is defined as $\lambda$, a phase change of the light incident from a side of the uppermost layer to the upper surface of the reflective layer and being reflected from the upper surface of the reflective layer to the side of the uppermost layer is defined as $\phi_1$, the optical distance of the first interval is defined as $L_1$, a phase change of the light incident from a side of the second electrode to the lower surface of the reflective layer and being reflected from the lower surface of the reflective layer to the side of the second electrode is defined as $\phi_2$, the optical distance of the second interval is defined as $L_2$, a phase change of the light incident from a side of the luminous layer to the upper surface of the first electrode and being reflected from the upper surface of the first electrode to the side of the luminous layer is defined as $\phi_3$, and the optical distance of the third interval is defined as $L_3$, there exists 0 or higher integers m satisfying one or more formulas in following formulas;

$$|L_1+(\phi_1/\pi-2m)\lambda/4|<\lambda/8(-\pi<\phi_1\leq\pi)$$

$$|L_2+(\phi_2/\pi-2m)\lambda/4|<\lambda/8(-\pi<\phi_2\leq\pi)$$

$$|L_3+(\phi_3/\pi-2m)\lambda/4|<\lambda/8(-\pi<\phi_3\leq\pi).$$

5. The light emitting device according to claim 1, wherein the control layer has a smaller thickness than the protecting layer.

6. The light emitting device according to claim 2, wherein the control layer has a smaller thickness than the protecting layer.

7. The light emitting device according to claim 1, wherein the control layer is disposed nearer to the second electrode than the protecting layer.

8. The light emitting device according to claim 2, wherein the control layer is disposed nearer to the second electrode than the protecting layer.

9. The light emitting device according to claim 1, wherein the protecting layer is disposed nearer to the second electrode than the control layer.

10. The light emitting device according to claim 2, wherein the protecting layer is disposed nearer to the second electrode than the control layer.

11. The light emitting device according to claim 1, wherein a refractivity $n_1$ of the control layer, and refractivities $n_2$, $n_3$ of respective layers disposed on both sides of the control layer have a relation of $n_3<n_1<n_2$, or $n_2<n_1<n_3$.

12. The light emitting device according to claim 2, wherein a refractivity $n_1$ of the control layer, and refractivities $n_2$, $n_3$ of respective layers disposed on both sides of the control layer have a relation of $n_3<n_1<n_2$, or $n_2<n_1<n_3$.

13. The light emitting device according to claim 1, wherein a refractivity $n_1$ of the control layer, and a refractivity $n_2$ of a layer disposed in contact to the control layer have a relation of $0.6\leq(n_1/n_2)\leq1.9$.

14. The light emitting device according to claim 2, wherein a refractivity $n_1$ of the control layer, and a refractivity $n_2$ of a layer disposed in contact to the control layer have a relation of $0.6\leq(n_1/n_2)\leq1.9$.

15. The light emitting device according to claim 1, wherein the plurality of luminous elements comprises at least three kinds of luminous elements including a blue color luminous element, a red color luminous element, and a green color luminous element.

16. The light emitting device according to claim 2, wherein the plurality of luminous elements comprises at least three kinds of luminous elements including a blue color luminous element, a red color luminous element, and a green color luminous element.

17. The light emitting device according to claim 1, wherein the plurality of luminous elements comprises a first color luminous element, a second color luminous element and a third color luminous element, and
wherein thicknesses of the control layers corresponding to each of the first to third color luminous elements are different from each other.

18. The light emitting device according to claim 2, wherein the plurality of luminous elements comprises a first color luminous element, a second color luminous element and a third color luminous element, and wherein thicknesses of the control layers corresponding to each of the first to third color luminous elements are different from each other.

19. The light emitting device according to claim 1, wherein the outside region comprises the control layer.

20. The light emitting device according to claim 1, wherein the outside region comprises the protective layer.

21. The light emitting device according to claim 1, wherein the outside region comprises the control layer and the protective layer.

22. The light emitting device according to claim 2, wherein the outside region comprises the control layer.

23. The light emitting device according to claim 2, wherein the outside region comprises the protective layer.

24. The light emitting device according to claim 2, wherein the outside region comprises the control layer and the protective layer.

* * * * *

UNITED STATES PATENT AND TRADEMARK OFFICE
CERTIFICATE OF CORRECTION

PATENT NO. : 7,608,991 B2 Page 1 of 1
APPLICATION NO. : 11/280684
DATED : October 27, 2009
INVENTOR(S) : Abe et al.

It is certified that error appears in the above-identified patent and that said Letters Patent is hereby corrected as shown below:

In Column 19, Line 25, in Claim 2, delete "region outside" and insert --outside region--, therefor.

Signed and Sealed this

Second Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,608,991 B2 Page 1 of 1
APPLICATION NO. : 11/280684
DATED : October 27, 2009
INVENTOR(S) : Abe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 702 days.

Signed and Sealed this

Twelfth Day of October, 2010

David J. Kappos
*Director of the United States Patent and Trademark Office*